(12) United States Patent
Gidney

(10) Patent No.: US 11,030,546 B2
(45) Date of Patent: Jun. 8, 2021

(54) MEASUREMENT BASED UNCOMPUTATION FOR QUANTUM CIRCUIT OPTIMIZATION

(71) Applicant: Google LLC, Mountain View, CA (US)

(72) Inventor: Craig Gidney, Goleta, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/833,344

(22) Filed: Mar. 27, 2020

(65) Prior Publication Data
US 2020/0311594 A1 Oct. 1, 2020

Related U.S. Application Data

(60) Provisional application No. 62/826,142, filed on Mar. 29, 2019.

(51) Int. Cl.
*G06N 10/00* (2019.01)
*G11C 11/4063* (2006.01)
*G06F 7/48* (2006.01)
*G06F 7/72* (2006.01)
*G06F 7/505* (2006.01)
*G06F 17/10* (2006.01)
*H04B 10/70* (2013.01)

(52) U.S. Cl.
CPC .......... *G06N 10/00* (2019.01); *G06F 7/4824* (2013.01); *G06F 7/5057* (2013.01); *G06F 7/72* (2013.01); *G06F 17/10* (2013.01); *G11C 11/4063* (2013.01); *H04B 10/70* (2013.01)

(58) Field of Classification Search
CPC ...... G06N 10/00; H04B 10/70; G06F 7/5057; G06F 17/10; G06F 7/4824; G06F 7/72; G11C 11/4063
See application file for complete search history.

(56) References Cited

U.S. PATENT DOCUMENTS

2020/0134107 A1* 4/2020 Low .................... G06N 10/00
2020/0311594 A1* 10/2020 Gidney ................ G06N 10/00

FOREIGN PATENT DOCUMENTS

WO WO 2019/050555 3/2019

OTHER PUBLICATIONS

PCT International Search Report and Written Opinion in International Appln. No. PCT/US2020/025453, dated Jul. 8, 2020, 16 pages.

(Continued)

*Primary Examiner* — Daniel D Chang
(74) *Attorney, Agent, or Firm* — Fish & Richardson P.C.

(57) ABSTRACT

Methods and apparatus for optimizing a quantum circuit. In one aspect, a method includes identifying one or more sequences of operations in the quantum circuit that uncompute respective qubits on which the quantum circuit operates; generating an adjusted quantum circuit, comprising, for each identified sequence of operations in the quantum circuit, replacing the sequence of operations with an X basis measurement and a classically-controlled phase correction operation, wherein a result of the X basis measurement acts as a control for the classically-controlled correction phase operation; and executing the adjusted quantum circuit.

18 Claims, 6 Drawing Sheets

(56) References Cited

OTHER PUBLICATIONS

Alagic et al., "Status Report on the First Round of the NIST Post-Quantum Cryptography Standardization Process," Tech. Rep., National Institute of Standards and Technology, Jan. 2019, 27 pages.
apps.nsa.gov [online], "CNSA Suite and Quantum Computing FAQ," retrieved from URL <https://apps.nsa.gov/iaarchive/library/ia-guidance/ia-solutions-for-classified/algorithm-guidance/cnsa-suite-and-quantum-computing-faq.cfm>, Jan. 2016, 11 pages.
Babbush et al., "Encoding Electronic Spectra in Quantum Circuits with Linear T Complexity," Physical Review X, Oct. 2018, 041015-1-041015-36.
Barends et al., "Superconducting quantum circuits at the surface code threshold for fault tolerance," Nature, Apr. 2014, 508:500-503.
Beauregard, "Circuit for Shor's algorithm using $2n^{+3}$ qubits," https://arxiv.org/abs/quant-ph/0205095v1, May 2002, 13 pages.
Berry et al., "Qubitization of Arbitrary Basis Quantum Chemistry by Low Rank Factorization," https://arxiv.org/abs/1902.02134v1, Feb. 2019, 20 pages.
Bocharov et al., "Efficient Synthesis of Universal Repeat-Until-Success Circuits," https://arxiv.org/abs/1404.5320v1, Apr. 2014, 16 pages.
Braithwaite, "Experimenting with Post-Quantum Cryptography," retrieved from URL <https://security.googleblog.com/2016/07/experimenting-with-post-quantum.html>, Jul. 2016, 5 pages.
Bravyi et al., "Universal quantum computation with ideal Clifford gates and noisy ancillas," Physical Review A, Feb. 2005, 71:022316-1-022316-14.
Buhler et al., "Factoring integers with the number field sieve," in The Development of the Number Field Sieve, Lecture Notes in Mathematics (LNM), 1993, 1554:50-94.
Campbell et al., "Applying quantum algorithms to constraint satisfaction problems," https://arxiv.org/abs/1810.05582v1, Oct. 2018, 26 pages.
Cuccaro et al., "A new quantum ripple-carry addition circuit," https://arxiv.org/abs/quant-ph/0410184, Oct. 2004, 9 pages.
De Beaudrap et al., "The ZX calculus is a language for surface code lattice surgery," https://arxiv.org/abs/1704.08670v1, Apr. 2017, 19 pages.
Diffie et al., "New Directions in Cryptography," IEEE Transactions on Information Theory, Nov. 1976, 22(6):644-654.
Draper et al., "A logarithmic-depth quantum carry-lookahead adder," https://arxiv.org/abs/quant-ph/0406142, Jun. 2004, 21 pages.
Eastin, "Distilling one-qubit magic states into Toffoli states," Physical Review A, Mar. 2013, 87:032321-1-032321-7.
Ekera et al., "Quantum Algorithms for Computing Short Discrete Logarithms and Factoring RSA Integers," International Workshop on Post-Quantum Cryptography, Jun. 2017, 347-363.
Ekera, "Modifying Shor's algorithm to compute short discrete logarithms," retrieved from URL <https://eprint.iacr.org/2016/1128.pdf>, Dec. 2016, 26 pages.
Ekera, "On post-processing in the quantum algorithm for computing short discrete logarithms," retrieved from URL <https://eprint.iacr.org/2017/1122.pdf>, Feb. 2019, 19 pages.
Ekera, "Quantum algorithms for computing general discrete logarithms and orders with tradeoffs," retrieved from URL <https://eprint.iacr.org/2018/797.pdf>, Mar. 2020, 52 pages.
Ekera, "Revisiting Shor's quantum algorithm for computing general discrete logarithms," https://arxiv.org/abs/1905.09084, May 2019, 13 pages.
Fowler et al., "A bridge to lower overhead quantum computation," https://arxiv.org/abs/1209.0510v1, Sep. 2012, 15 pages.
Fowler et al., "Low overhead quantum computation using lattice surgery," https://arxiv.org/abs/1808.06709v1, Aug. 2018, 15 pages.
Fowler et al., "Surface codes: Towards practical large-scale quantum computation," Physical Review. A, Sep. 2012, 86:032324-1-032324-48.
Fowler et al., "Surface code implementation of block code state distillation," Scientific Reports, Jun. 2013, 3(1939):1-6.
Fowler, "Time-optimal quantum computation," https://arxiv.org/abs/1210.4626v1, Oct. 2012, 5 pages.
Gheorghiu et al., "Quantum cryptanalysis of symmetric, public-key and hash-based cryptographic schemes," https://arxiv.org/abs/1902.02332v1, Feb. 2019, 19 pages.
Gidney et al., "Efficient magic state factories with a catalyzed |CCZ> to 2|T> transformation," https://arxiv.org/abs/1812.01238v1, Dec. 2018, 24 pages.
Gidney et al., "How to factor 2048 bit RSA integers in 7 hours using 23 million noisy qubits," https://arxiv.org/abs/1905.09749, last revised Dec. 2019, 26 pages.
Gidney et al., "How to factor 2048 bit RSA integers in 7 hours using 23 million noisy qubits," https://arxiv.org/abs/1905.09749v1, May 2019, 25 pages.
Gidney et al., "Efficient magic state factories with a catalyzed |CCZ> to 2|T> transformation," https://arxiv.org/abs/1812.01238v3, last revised Apr. 2019, 24 pages.
Gidney et al., "Flexible layout of surface code computations using AutoCCZ states," https://arxiv.org/abs/1905.08916, May 2019, 17 pages.
Gidney, "Factoring with $n^{+2}$ clean qubits and n−1 dirty qubits," https://arxiv.org/abs/1706.07884v1, Jun. 2017, 13 pages.
Gidney, "Halving the cost of quantum addition," Quantum 2, Jun. 2018, 6 pages.
Gidney, "Approximate encoded permutations and piecewise quantum adders," https://arxiv.org/abs/1905.08488, May 2019, 15 pages.
Gidney, "Asymptotically Efficient Quantum Karatsuba Multiplication," https://arxiv.org/abs/1904.07356, Apr. 2019, 11 pages.
Gidney, "Windowed quantum arithmetic," https://arxiv.org/abs/1905.07682, May 2019, 11 pages.
Gillmor, "RFC 7919: Negotiated Finite Field Diffie-Hellman Ephemeral Parameters for Transport Layer Security (TLS)," retrieved from URL <https://www.hjp.at/doc/rfc/rfc7919.html>, Aug. 2016, 30 pages.
github.com [online], "OpenSSL Software Foundation, Openssl source code: Line 32 of apps/dhparam.c," retrieved from URL <https://github.com/openssl/openssl/blob/07f434441e7ea385f975e8df8caa03e62222ca61/apps/dhparam.c#L32>, Dec. 2018, 6 pages.
github.com [online], "Quirk: A drag-and-drop quantum circuit simulator for exploring small quantum circuits," available on or before Jun. 11, 2018, via Internet Archive: Wayback Machine URL <https://web.archive.org/web/20180611035822/https://github.com/Strilanc/Quirk>, retrieved on Jun. 30, 2020, URL <https://github.com/Strilanc/Quirk>, 3 pages.
gnupg.org [online], "GnuPG frequently asked questions—11.2 Why Does GnuPG Default to 2048 bit RSA-2048?" available on or before Jul. 1, 2016, via Internet Archive: Wayback Machine URL <https://web.archive.org/web/20160701194147/https://www.gnupg.org/faq/gnupg-faq.html#default_rsa2048>, retrieved on Jun. 29, 2020, URL <https://www.gnupg.org/faq/gnupg-faq.html#default_rsa2048>, 22 pages.
Gordon, "Discrete logarithms in GF(p) using the Number Field Sieve," SIAM Journal on Discrete Mathematics, 1993, 6:124-138.
Gottesman et al., "Demonstrating the viability of universal quantum computation using teleportation and single-qubit operations," Nature, Nov. 1999, 402:390-393.
Gottesman, "The Heisenberg Representation of Quantum Computers," https://arxiv.org/abs/quant-ph/9807006, Jul. 1998, 20 pages.
Griffiths et al., "Semiclassical Fourier Transform for Quantum Computation," Physical Review Letters, Apr. 1996, 76(17):3228-3231.
Haah et al., "Codes and Protocols for Distilling T, controlled-S, and Toffoli Gates," Quantum 2, retrieved from URL <https://arxiv.org/abs/1709.02832v3>, May 2018, 29 pages.
Haner et al., "Factoring using 2n+2 qubits with Toffoli based modular multiplication," https://arxiv.org/abs/1611.07995v1, Nov. 2016, 7 pages.
Hastings et al., "Reduced Space-Time and Time Costs Using Dislocation Codes and Arbitrary Ancillas," https://arxiv.org/abs/1408.3379v1, Aug. 2014, 16 pages.
Horsman et al., "Surface code quantum computing by lattice surgery," New Journal of Physics, Dec. 2012, 28 pages.

(56) References Cited

OTHER PUBLICATIONS

Jeandel et al., "A Complete Axiomatisation of the ZX-Calculus for Clifford+T Quantum Mechanics," Proceedings of the 33rd Annual ACM/IEEE Symposium on Logic in Computer Science, Jul. 2018, 10 pages.
Jones, "Low-overhead constructions for the fault-tolerant Toffoli gate," Physical Review A, Feb. 2013, 022328-1-022328-4.
Karatsuba et al., "Multiplication of many-digital numbers By automatic computers," Doklady Akademii Nauk, Russian Academy of Sciences, Feb. 1962, 145(2):293-294 (with English translation).
keylength.com [online], "BlueKrypt—Cryptographic Key Length Recommendation," available on or before Mar. 3, 2019, via Internet Archive: Wayback Machine URL <https://web.archive.org/web/20190303042857/https://www.keylength.com/>, retrieved on Jun. 29, 2020, URL <https://www.keylength.com>, 1 page.
Kim et al., "Flipping bits in memory without accessing them: An experimental study of DRAM disturbance errors," 2014 ACM/IEEE 41st International Symposium on Computer Architecture (ISCA), Jun. 2014, 12 pages.
Kitaev, "Fault-tolerant quantum computation by anyons," Annals of Physics, Jan. 2003, 303(1):2-30.
Kivinen et al., "RFC 3526: More Modular Exponentiation (MODP) Diffie-Hellman groups for Internet Key Exchange (IKE)," retrieved from URL <https://www.hjp.at/doc/rfc/rfc3526.html>, May 2003, 11 pages.
Kleinjung et al., "Factorization of a 768-Bit RSA Modulus," Lecture Notes in Computer Science: Advanced in Cryptology: CRYPTO 2010, 2010, 6223:333-350.
Lenstra et al., "Selecting Cryptographic Key Sizes," Journal of Cryptology, 2001, 14:225-293.
Lenstra et al., "The number field sieve," Proceedings of the 22nd Annual ACM Symposium on the Theory of Computing (STOC), 1990, 564-572.
Lenstra, "Key Lengths," The Handbook of Information Security, retrieved from URL <http://citeseerx.ist.psu.edu/viewdoc/download;jsessionid=F4B43E1DEB9BD699C0F03EA08A2AD810?doi=10.1.1.694.8206&rep=rep1&type=pdf>, 2004, 32 pages.
Li, "A magic state's fidelity can be superior to the operations that created it," New Journal of Physics, Feb. 2015, 17:1-7.
linux.die.net [online], "ssh-keygen(1)—Linux man page," available on or before Mar. 25, 2018, via Internet Archive: Wayback Machine URL <https://web.archive.org/web/20180325042106/https://linux.die.net/man/1/ssh-keygen>, retrieved on Jun. 29, 2020, URL <https://linux.die.net/man/1/ssh-keygen>, 3 pages.
listserv.nodak.edu [online], "795-bit factoring and discrete logarithms," retrieved from URL <https://listserv.nodak.edu/cgi-bin/wa.exe?A2=NMBRTHRY;fd743373.1912&FT=M&P=T&H=&S=>, Dec. 2, 2019, 2 pages.
Litinski, "A Game of Surface Codes: Large-Scale Quantum Computing with Lattice Surgery," https://arxiv.org/abs/1808.02892v1, Aug. 2018, 35 pages.
Litinski, "Magic State Distillation: Not as Costly as You Think," https://arxiv.org/abs/1905.06903v1, May 2019, 20 pages.
Low et al., "Trading T-gates for dirty qubits in state preparation and unitary synthesis," https://arxiv.org/abs/1812.00954, Dec. 2018, 11 pages.
Mosca et al., "The Hidden Subgroup Problem and Eigenvalue Estimation on a Quantum Computer," Proceeding from the First NASA International Conference: Quantum Computing and Quantum Communications (QCQC1998), May 1999, 1509:174-188.
Mosca, "Cybersecurity in an Era with Quantum Computers: Will We Be Ready?" IEEE Security & Privacy, Oct. 2018, 16(5): 38-41 (2018).
NIST and CCCS, "Implementation Guidance for FIPS 140-2 and the Cryptographic Module Validation Program," retrieved from URL <https://web.archive.org/web/20190313055345/https://csrc.nist.gov/csrc/media/projects/cryptographic-module-validation-program/documents/fips140-2/fips1402ig.pdf, Feb. 5, 2019, 240 pages.
NIST, "Recommendation for Key Management, Part 1: General (SP 800-57 Part 1 Rev. 4)," retrieved from URL <https://nvlpubs.nist.govi/nistpubs/SpecialPublications/NIST.SP.800-57pt1r4.pdf>, Jan. 2016, 161 pages.
NIST, "Recommendation for Pair-Wise Key-Establishment Schemes Using Discrete Logarithm Cryptography (SP 800-56A Rev. 3)," retrieved from URL <https://nvlpubs.nist.gov/nistpubs/SpecialPublications/NIST.SP.800-56Ar3.pdf>, Apr. 2018, 152 pages.
NIST, "Digital Signature Standard (DSS) (FIPS PUB 186-4)," retrieved from URL <https://nvlpubs.nist.gov/nistpubs/FIPS/NIST.FIPS.186-4.pdf>, Jul. 2013, 130 pages.
O'Gorman et al., "Quantum computation with realistic magic-state factories," Physical Review A, Mar. 2017, 032338-1-032338-19.
Parent et al., "Improved reversible and quantum circuits for Karatsuba-based integer multiplication," https://arxiv.org/abs/1706.03419, Jun. 2017, 16 pages.
Parker et al., "Efficient Factorization with a Single Pure Qubit and log N Mixed Qubits," Physical Review Letters, Oct. 2000, 85(14):3049-3052.
Pohlig et al., "An Improved Algorithm for Computing Logarithms over GF(p) and Its Cryptographic Significance," IEEE Transactions on Information Theory, Jan. 1978, 24(1): 106-110.
Pollard, "Factoring with cubic integers," Lecture Notes in Mathematics: The Development of the Number Field Sieve, Oct. 2006, 4-10.
Pollard, "Monte Carlo Methods for Index Computation (mod p)," Mathematics of Computation, Jul. 1978, 32(143):918-924 (1978).
Pollard, "The lattice sieve," The Development of the Number Field Sieve, Lecture Notes in Mathematics (LNM), 1993, 1554:43-49.
Pomerance, "A Tale of Two Sieves," Notices of the AMS, Dec. 1996, 43(12):1473-1485.
Raussendorf et al., "A fault-tolerant one-way quantum computer," Annals of Physics, Sep. 2006, 321(9):2242-2270.
Raussendorf et al., "Fault-Tolerant Quantum Computation with High Threshold in Two Dimensions," Physical Review Letters 98, May 2007, 190504-1-190504-4.
Rivest et al., "A method for obtaining digital signatures and public-key cryptosystems," Communications of the ACM, Feb. 1978, 21(2):120-126.
Roetteler et al., "Quantum Resource Estimates for Computing Elliptic Curve Discrete Logarithms," Proceedings of the 23rd International Conference on the Theory and Application of Cryptology and Information Security: Advances in Cryptology (ASIACRYPT 2017), Lecture Notes in Computer Science (LNCS), Nov. 2017, 10625:241-270.
Schirokauer, "Discrete Logarithms and Local Units," Philosophical Transactions of the Royal Society A, Nov. 1993, 345(1676):409-423.
Schonhage et al., "Schnelle Multiplikation großer Zahlen," Computing 7, Sep. 1971, 281-292 (with English summary).
Schroeder et al., "DRAM Errors in the Wild: A Large-Scale Field Study," ACM SIGMETRICS Performance Evaluation Review, Jun. 2009, 37, 193-204.
Shor, "Algorithms for quantum computation: Discrete logarithms and factoring," Proceedings 35th Annual Symposium on Foundations of Computer Science, Nov. 1994, 124-134.
smartcardfocus.com [online], "JavaCOS A22 dual interface Java card—150K," available on or before Dec. 18, 2016, via Internet Archive: Wayback Machine URL <https://web.archive.org/web/20161218155914/http://www.smartcardfocus.com/shop/ilp/id~712/javacos-a22-dual-interface-java-card-150k/p/index.shtml>, retrieved on Jun. 29, 2020, URL <https://www.smartcardfocus.com/shop/ilp/id~712/javacos-a22-dual-interface-java-card-150k/p/index.shtml>, 1 page.
Van Meter et al., "Fast quantum modular exponentiation," Physical Review A, May 2005, 71:052320-1-052320-12.
Van Oorschot et al., "On Diffie-Hellman Key Agreement with Short Exponents," Proceedings of the International Conference on the Theory and Applications of Cryptographic Techniques, Advanced in Cryptology (EUROCRYPT 1996), 1996, 1070:332-343.
Vedral et al., "Quantum networks for elementary arithmetic operations," Physical Review A, Jul. 1996, 147-153.

(56) References Cited

OTHER PUBLICATIONS wikipedia.org [online], "Timeline of quantum computing," available on or before Nov. 19, 2018, via Internet Archive: Wayback Machine URL <https://web.archive.org/web/20181119015658/https://en.wikipedia.org/wiki/Timeline_of_quantum_computing>, retrieved on Jun. 30, 2020, URL <https://en.wikipedia.org/wiki/Timeline_of_quantum_computing>, 13 pages.

Zalka, "Fast versions of Shor's quantum factoring algorithm," https://arxiv.org/abs/quant-ph/9806084, Jun. 1998, 37 pages.

Zalka, "Shor's algorithm with fewer (pure) qubits," https://arxiv.org/abs/quant-ph/0601097, Jan. 2006, 12 pages.

* cited by examiner

MEASUREMENT BASED UNCOMPUTATION FOR QUANTUM CIRCUIT OPTIMIZATION

CLAIM OF PRIORITY

This application claims priority under 35 USC § 119(e) to U.S. Patent Application Ser. No. 62/826,142, filed on Mar. 29, 2019, the entire contents of which are hereby incorporated by reference.

BACKGROUND

This specification relates to quantum computing.

Classical computers have memories made up of bits, where each bit can represent either a zero or a one. Quantum computers maintain sequences of quantum bits, called qubits, where each quantum bit can represent a zero, one or any quantum superposition of zeros and ones. Quantum computers operate by setting qubits in an initial state and controlling the qubits, e.g., according to a sequence of quantum logic gates.

SUMMARY

This specification describes techniques for optimizing quantum circuits using measurement-based uncomputation.

In general, one innovative aspect of the subject matter described in this specification can be implemented in a method for uncomputing one or more qubits, the method comprising: identifying one or more sequences of operations for performing an un-compute operation on the one or more qubits, respectively; for each identified sequence of operations, replacing the sequence of operations with an X basis measurement and a classically-controlled phase correction operation to provide an adjusted one or more sequence of operations for performing the un-compute operation, wherein a result of the X basis measurement acts as a control for the classically-controlled correction phase operation; and executing the adjusted one or more sequence of operations on the one or more qubits, respectively.

Other implementations of these aspects includes corresponding computer systems, apparatus, and computer programs recorded on one or more computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations a first sequence of operations for un-computing a respective qubit comprises a first subset of operations that put the qubit in a known state, for example a zero state.

In some implementations the identified one or more sequences of operations comprise X-axis interactions.

In some implementations the identified one or more sequences of operations comprise at least one CNOT operation that targets a first qubit and uses a second qubit as a control.

In some implementations replacing the sequence of operations comprises replacing the CNOT operation with: a measurement of the first qubit in the X basis, and application of a Z gate on the first qubit, wherein application of the Z gate is conditioned on a result of the measurement of the first qubit in the X basis.

In some implementations executing the adjusted one or more sequences of operations on the one or more qubits comprises executing the adjusted one or more sequences of operations on the one or more qubits in a surface-code architecture.

In some implementations the one or more sequences of operations for performing an un-compute operation on the one or more qubits are part of a quantum circuit, the quantum circuit comprising multiple operations for uncomputing a table lookup operation, wherein the multiple operations operates on i) a control register comprising one or more qubits, ii) an address register comprising one or more qubits, and iii) a target register comprising one or more qubits.

In some implementations replacing the sequence of operations with an X basis measurement and a classically-controlled phase correction operation to provide an adjusted one or more sequence of operations for performing the un-compute operation comprises generating an adjusted quantum circuit.

In some implementations executing the adjusted one or more sequences of operations on the one or more qubits, respectively, comprises executing the adjusted quantum circuit, comprising: applying a CNOT operation to a first qubit in the address register and a second qubit, wherein: the first qubit represents a least significant bit, the second qubit comprises an ancilla qubit prepared in a 1 state, and the first qubit acts as a control for the CNOT operation; applying a first Hadamard gate to the first qubit and a second Hadamard gate to the second qubit; applying multiple X basis measurements on qubits in the target register to determine a set of address register states that require an amplitude negation to uncompute the table lookup operation; applying a classically controlled phase correction operation based on the determined set of address register states, comprising applying an additional table lookup computation from a fixup table onto the first qubit and second qubit to negate amplitudes of the states in the determined set of address register states; and uncomputing the first qubit and second qubit.

In some implementations entries of the fixup table specify respective two output bits defined by the determined set of states.

In some implementations entries $F_j$ of the fixup table F are expressed as $$F_j = \begin{cases} 00 & (2j \notin S) \wedge (2j+1 \notin S) \\ 01 & (2j \in S) \wedge (2j+1 \notin S) \\ 10 & (2j \notin S) \wedge (2j+1 \in S) \\ 11 & (2j \in S) \wedge (2j+1 \in S) \end{cases}$$

where S represents the determined set of states.

In some implementations uncomputing the first qubit and the second qubit comprises: applying a third Hadamard gate to the first qubit and a fourth Hadamard gate to the second qubit, and applying a CNOT operation to the first qubit and second qubit, where the first qubit acts as a control for the CNOT operation.

In some implementations the adjusted quantum circuit is configured to operate on multiple clean ancilla qubits.

In some implementations the adjusted quantum circuit is configured to operate on multiple dirty ancilla qubits.

The subject matter described in this specification can be implemented in particular ways so as to realize one or more of the following advantages.

The presently described techniques produce optimized quantum circuits that, when executed, can perform corresponding quantum computations with increased computational efficiency.

For example, the presently described techniques can produce optimized quantum circuits for uncomputing table lookup operations. Instead of reversing the quantum circuit for computing the table lookup operation, X measurements and classically controlled phase fix up operations are applied. Table lookup operations can therefore be uncomputed with reduced computational complexity. The computational complexity does not depend on the size of the target register M. In addition, ancilla qubits used by the table lookup computation only need to be used temporarily, and can be erased after the table lookup computation and reused.

In addition, because the lookup result is measured in the X basis, qubits that were part of the lookup result are available for use in other operations (whereas otherwise they would have been unavailable for use.) This somewhat counterintuitively means that starting the uncomputation process can result in more space being available right away (instead of only after it ends). For example, the uncomputation can free up so many qubits that the uncomputation does not require ancilla qubits from other sources. This means that the uncomputation can run inline.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Overview

This specification describes techniques for optimizing quantum circuits by uncomputing qubits using measurement-based uncomputation. Sequences of unitary operations that uncompute a qubit, e.g., those involving X-axis interactions, are replaced with measurements, e.g., X-basis measurements, and classically controlled phase correction operations. The techniques can be applied to various quantum circuit constructions, including quantum circuits for computing and uncomputing table lookups.

Example Hardware

Figure 1:
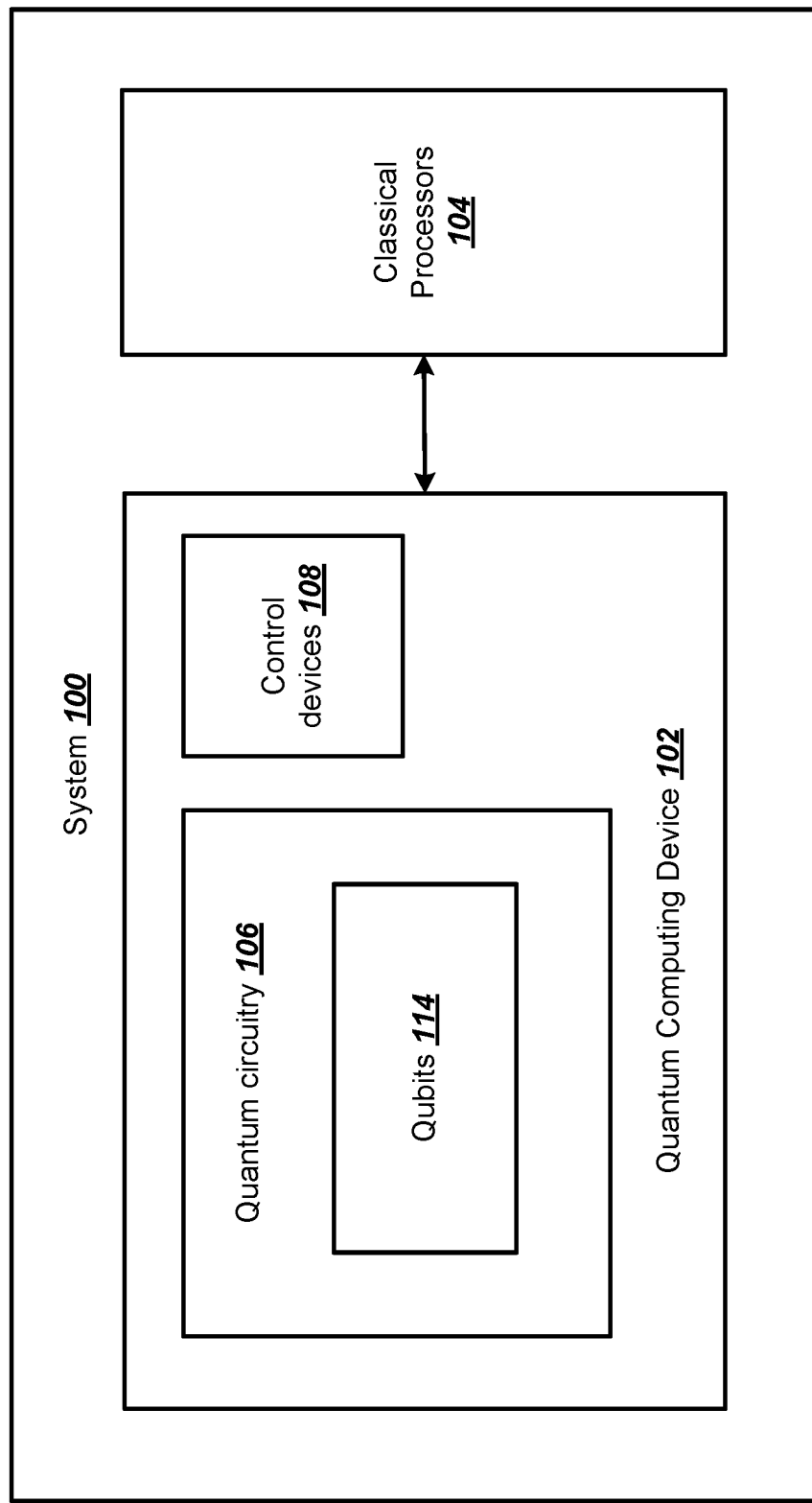
FIG. 1 shows an example quantum computation system.

FIG. 1 depicts an example quantum computation system 100. The system 100 is an example of a system implemented as quantum and classical computer programs on one or more quantum computing devices and classical computers in one or more locations, in which the systems, components, and techniques described below can be implemented.

The system 100 includes a quantum computing device 102 in data communication with one or more classical processors 104. For convenience, the quantum computing device 102 and classical processors 104 are illustrated as separate entities, however in some implementations the classical processors 104 may be included in the quantum computing device 102.

The quantum computing device 102 includes components for performing quantum computation. For example, the quantum computing device 102 includes quantum circuitry 106 and control devices 108.

The quantum circuitry 106 includes components for performing quantum computations, e.g., components for implementing the various quantum circuits and operations described in this specification. For example, the quantum circuitry may include a quantum system that includes one or more multi-level quantum subsystems, e.g., qubits 114. The qubits 114 are physical qubits that may be used to perform algorithmic operations or quantum computations. The specific realization of the one or more qubits and their interactions may depend on a variety of factors including the type of quantum computations that the quantum computing device 102 is performing. For example, the qubits may include qubits that are realized via atomic, molecular or solid-state quantum systems. In other examples the qubits may include, but are not limited to, superconducting qubits, e.g., Gmon or Xmon qubits, or semi-conducting qubits. Further examples of realizations of multi-level quantum subsystems include fluxmon qubits, silicon quantum dots or phosphorus impurity qubits. In some cases the quantum circuitry may further include one or more resonators attached to one or more superconducting qubits. In some cases ion traps, photonic devices or superconducting cavities (with which states may be prepared without requiring qubits) may be used.

In this specification, the term "quantum circuit" is used to refer to a sequence of quantum logic operations that can be applied to a qubit register to perform a respective computation. Quantum circuits comprising different quantum logic operations, e.g., single qubit gates, multi-qubit gates, etc., may be constructed using the quantum circuitry 106. Constructed quantum circuits can be operated/implemented/executed using the control devices 108.

The type of control devices (or control circuits) 108 included in the quantum system depend on the type of qubits included in the quantum computing device. For example, in some cases the multiple qubits can be frequency tunable. That is, each qubit may have associated operating frequencies that can be adjusted using one or more control devices. Example operating frequencies include qubit idling frequencies, qubit interaction frequencies, and qubit readout frequencies. Different frequencies correspond to different operations that the qubit can perform. For example, setting the operating frequency to a corresponding idling frequency may put the qubit into a state where it does not strongly interact with other qubits, and where it may be used to perform single-qubit gates. In these examples the control devices 108 may include devices that control the frequencies of qubits included in the quantum circuitry 106, an excitation pulse generator and control lines that couple the qubits to the excitation pulse generator. The control devices may then cause the frequency of each qubit to be adjusted towards or away from a quantum gate frequency of an excitation pulse on a corresponding control driveline.

The control devices 108 may further include measurement devices, e.g., readout resonators. Measurement results obtained via measurement devices may be provided to the classical processors 104 for processing and analyzing. Measurement devices perform physical measurements on properties of the qubits, either directly or indirectly, from which the state(s) of the qubits can be inferred.

Programming the Hardware: An Example Process for Optimizing a Quantum Circuit

Figure 2:
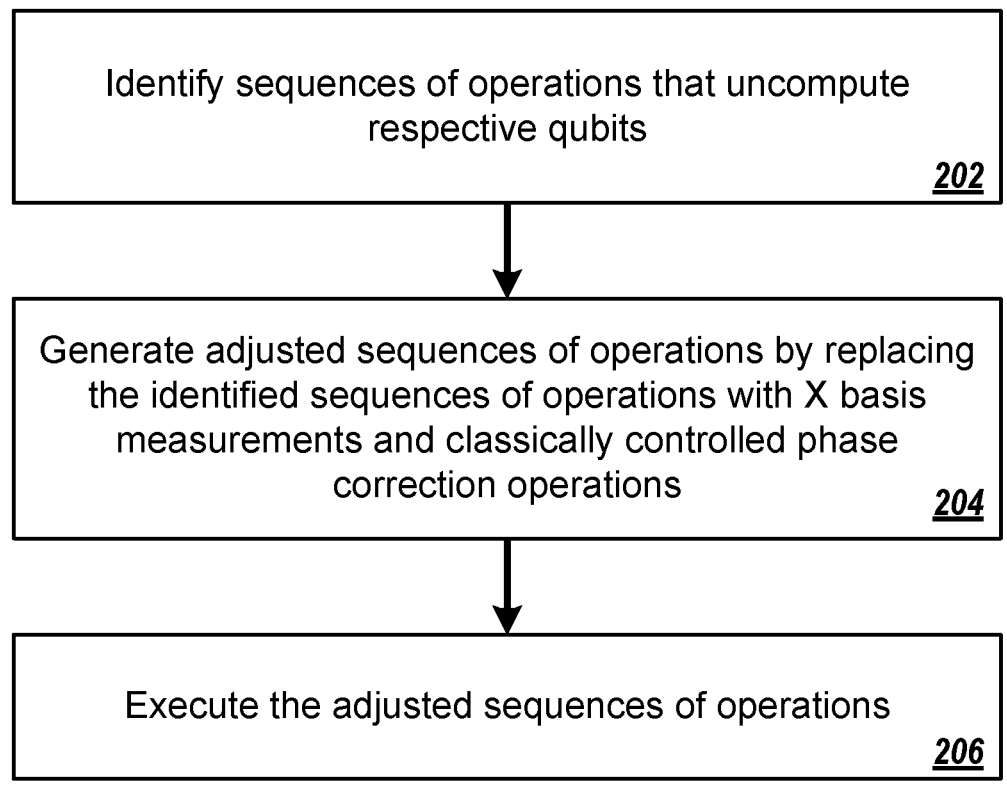
FIG. 2 is a flow diagram of an example process for uncomputing one or more qubits.

FIG. 2 is a flow diagram of an example process 200 for uncomputing one or more qubits. For convenience, the process 200 will be described as being performed by a system of one or more classical and quantum computing devices located in one or more locations. For example, a quantum computation system, e.g., the system 100 of FIG. 1, appropriately programmed in accordance with this specification, can perform the process 200.

The system identifies one or more sequences of operations for performing an uncompute operation on the one or more qubits, respectively (step 202). For example, the system may identify one or more sequences of operations that uncompute one or more qubits in a quantum circuit. A sequence of operations that un-computes a respective qubit can include a sequence of unitary operations that put the qubit in a known state, for example a zero state. In some implementations the identified one or more sequences of operations can include X-axis interactions that put one or more qubits in a zero state.

For each identified sequence of operations, the system replaces the sequence of operations with an X basis measurement and a classically-controlled phase correction operation to provide an adjusted one or more sequence of operations for performing the uncompute operation (step 204). A result of the X basis measurement acts as a control for the classically-controlled phase correction operation.

The sequences of operations that uncompute respective qubits are replaced with operations that include a computationally more efficient operation (implemented by measurements) that is probabilistic but will be close to a target result, and a classical operation that uses measurement results to determine how the computationally more efficient operation differed the intended operation and applies additional operations to remove the difference. The benefit is that the expected cost of these dynamically chosen operations is lower than the cost of an alternative implementation.

For example, in some implementations a quantum circuit may uncompute a qubit q by performing a series of unitary operations, where the last operation involving q is a CNOT operation that targets q. In these implementations the system may first measure q in the X basis and replace the CNOT operation with a Z gate conditioned on a result of the measurement of q in the X basis. A CNOT gate is equivalent to an X gate on the target control controlled by a Z type control on the control qubit, or equivalently to an X type control on the target controlling a Z gate on the control qubit. The deferred measurement principle states that a classical control after a measurement is equivalent to a quantum control before a measurement. This principle can be applied to the CNOT target in the X basis instead of to the CNOT control in the Z basis. The application of the Z gate is controlled by the measurement via a classical control system. The classical control system can be configured to check the result of the particular measurement and, if the result is True, cause a Z gate to be applied. The Z gate may be applied either by instructing the quantum computer to perform the Z gate, or by updating a classically tracked so-called Pauli frame (which tracks, for each qubit, whether it has been bit flipped and/or phase flipped, which ultimately results in certain measurement results being inverted before being processed).

Providing the adjusted one or more sequences of operations for performing an uncompute operation can include generating an adjusted quantum circuit. Generating an adjusted quantum circuit may include adjusting a setup or operational parameters of the quantum computation system that executes the adjusted quantum circuit. For example, control devices or circuits used to implement the different sequences of operations that include X basis measurements and classically controlled phase operations can be appropriately initialized/configured.

The system executes the adjusted one or more sequences of operations on the one or more qubits, respectively (step 206). For example, the system can execute the adjusted quantum circuit described above using a quantum computing device, e.g., using the above described appropriately initialized/configured control devices. In some implementations the system executes the adjusted quantum circuit in a surface-code architecture. In implementations where CNOT operations are replaced with an X basis measurement and classically controlled Z gate, as described above, executing the adjusted quantum circuit in a surface code architecture can be particularly advantageous because Z gates require no spacetime volume in the surface code.

Programming the Hardware: Example Processes for Optimizing a Quantum Circuit that Uncomputes a Table Lookup In some implementations the identified sequences of operations/quantum circuit described above with reference to FIG. 2 can be a quantum circuit that computes and uncomputes a table lookup. In these implementations, the quantum circuit operates on an address register of qubits and a target register of qubits. The state of the address register encodes address information that determines a respective state of the target register. The state of the target register encodes a target output. A relationship between each state of the address register and each state of the target register can be represented as a table.

Each entry in the table can be represented by a respective multi-control multi-target CNOT operation, where qubits in the address register act as controls and qubits in the target register are targets for the CNOT operation. There can be one control (or anti control) for each address qubit, and one CNOT target (or skip) for each output qubit. For example, suppose the state of the address register points to entry number 2 of the table and the entry is the bit string 10011000. This means that a table lookup compute operation toggles the qubits at offset 0, 3, and 4 of the target register conditioned on the address register storing 2.

A corresponding table lookup uncompute operation negates the amplitude of the $|2\rangle$ state of the address register, conditioned on the $X_0 \cdot X_3 \cdot X_4$ observable of the qubits in the target register. Because the qubits in the target register are measured in the X basis, the value of the $X_0 \cdot X_3 \cdot X_4$ observable is known. Therefore, it is known whether or not the amplitude of the $|2\rangle$ state of the address register needs to be negated or not. Extending the example, by using the measured observables, it can be determined for each state $|j\rangle$ of the address register whether the or not the state $|j\rangle$ needs to be negated or not. Once the required negations are determined, performing the negations uncomputes the table lookup.

Formally, a table lookup computation be defined as applying the transformation $$\sum_{j=1}^{d} |j\rangle|0\rangle \mapsto \sum_{j=1}^{d} |j\rangle|f(j)\rangle$$

where $|j\rangle$ represents the state of the address register, $|0\rangle$ represents the initial state of the target register, and $|f(j)\rangle$ represents a transformed state of the target register after a table lookup $f: \mathbb{Z}_d \mapsto \mathbb{Z}_2^M$ is computed, with k representing a power of 2 satisfying 1<k<d, and M representing the size of the target register.

Uncomputing a table lookup can be defined as applying the transformation $$\sum_{j=1}^{d} |j\rangle|f(j)\rangle \mapsto \sum_{j=1}^{d} |j\rangle|0\rangle.$$

As described in more detail below, uncomputing a table lookup using the techniques described in this specification can be achieved using $\lceil d/k \rceil + k$ Toffoli gates (CCNOT gates) and $k+\lceil \log(d/k) \rceil$ clean ancilla qubits (qubits that are prepared in a known state), or alternatively using $2\lceil d/k \rceil + 4M(k-1)$ Toffoli gates, $k-1$ dirty ancilla qubits (qubits that are already being used for another purpose by the quantum computing hardware and are not necessarily initialized to a known state) and $\lceil \log(d/k) \rceil + 1$ clean ancilla qubits.

Figure 3:
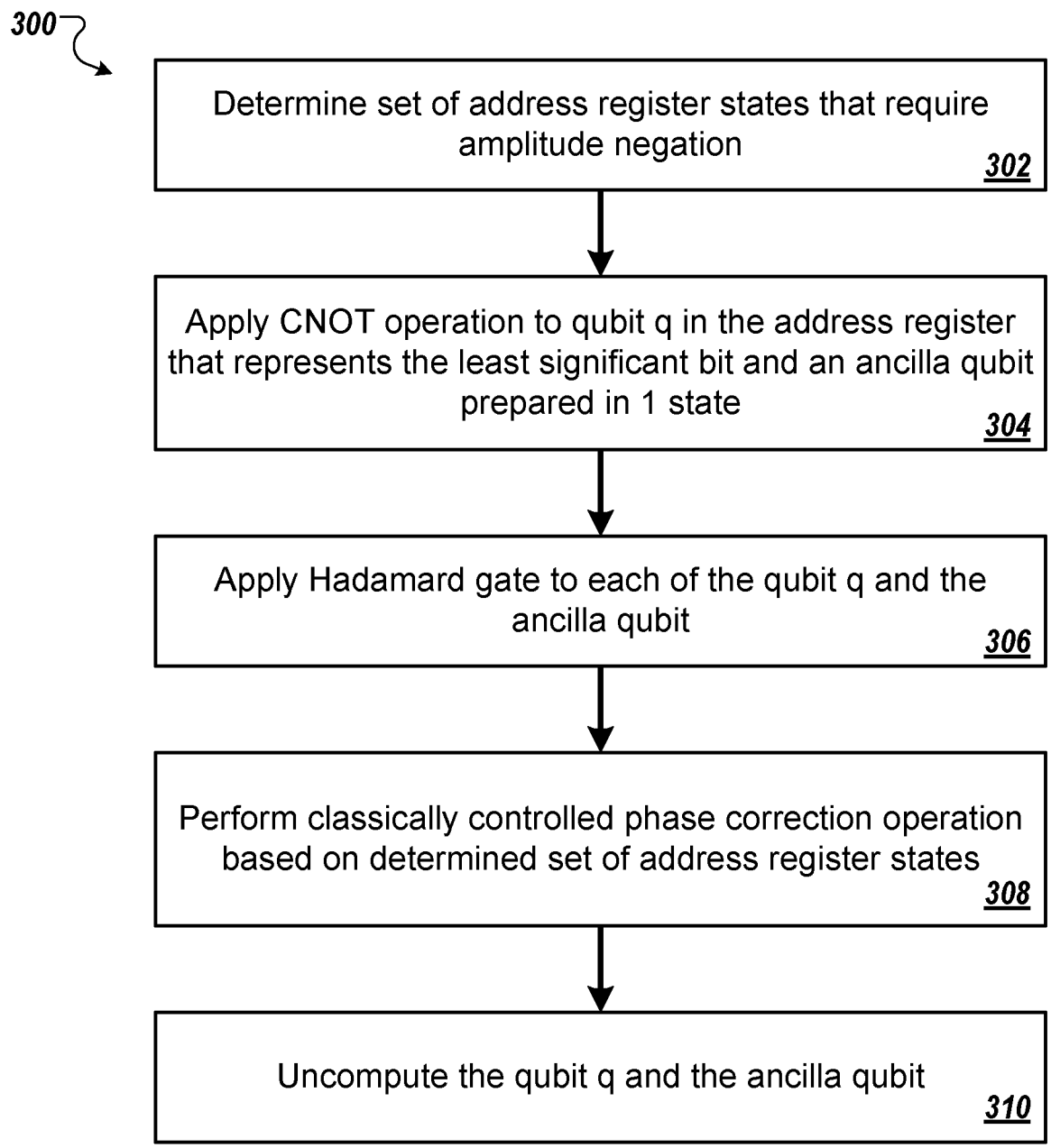
FIG. 3 is a flow diagram of an example process for uncomputing a table lookup using an optimized quantum circuit.

FIG. 3 is a flow diagram of an example process 300 for uncomputing a table lookup using an optimized quantum circuit. For convenience, the process 300 will be described as being performed by a system of one or more classical or quantum computing devices located in one or more locations. For example, a quantum computation system, e.g., the system 100 of FIG. 1, appropriately programmed in accordance with this specification, can perform the process 300.

The system determines a set S of address register states that require an amplitude negation in order to complete the uncomputation of the table lookup (step 302). The determined set S will be a subset of the set of all address register states from $|0\rangle$ to $|d-1\rangle$, and depends on the particular table lookup computation that is being uncomputed. The system can determine the set S using X basis measurements of the qubits in the target register, as described above with reference to FIG. 2.

The system applies a CNOT operation to qubit q in the address register that represents the least significant bit and a clean ancilla qubit u prepared in the $|1\rangle$ state (step 304). The qubit q acts as the control for the CNOT operation. The system then applies a Hadamard gate to both qubit q and qubit u (step 306).

The system performs a classically controlled phase correction operation based on the determined set S (step 308). The classically controlled phase correction operation includes an additional table lookup computation from a fixup table F onto the qubits q and u. Entries $F_j$ of the fixup table F specify respective two output bits defined by the set S:

$$F_j = \begin{cases} 00 & (2j \notin S) \land (2j+1 \notin S) \\ 01 & (2j \in S) \land (2j+1 \notin S) \\ 10 & (2j \notin S) \land (2j+1 \in S) \\ 11 & (2j \in S) \land (2j+1 \in S) \end{cases}$$

The fixup table F relates to all of the qubits in the address register, except for the least significant qubit. The particular construction of the fixup table F and particular preparation of q and u in steps 304, 306 ensures that the amplitudes of all states in S are negated. Negation of the amplitudes in the determined set S uncomputes the table lookup, and the system completes the uncomputation by uncomputing the preparation of q and u (step 310). Uncomputing the preparation of q and u can include applying a Hadamard gate to both q and u, and applying a CNOT operation to q and u, where q acts as the control.

When qubits of the target register are measured in the X basis, this results in some determined-by-the-measurement-results subset of the possible address states having their amplitudes negated. Every address K has some associated data, specified as bits. During the lookup process, if the address is K then each bit determines whether or not a target qubit is flipped. When the X basis measurement is performed, some of the target qubits have TRUE measurement results. If an address K would have resulted in an odd number of the target qubits whose X basis measurement result was TRUE getting flipped, then the phase associated with K is negated. Otherwise it is not negated. The table F is created by checking, for each possible value of K, whether it has this "odd flips of trues" property or not. The target register is effectively destroyed by measuring it in the X basis. After the measurement all of its qubits are in a known state, and so they can individually be transformed or re-initialized into a zero state.

Figure 4:
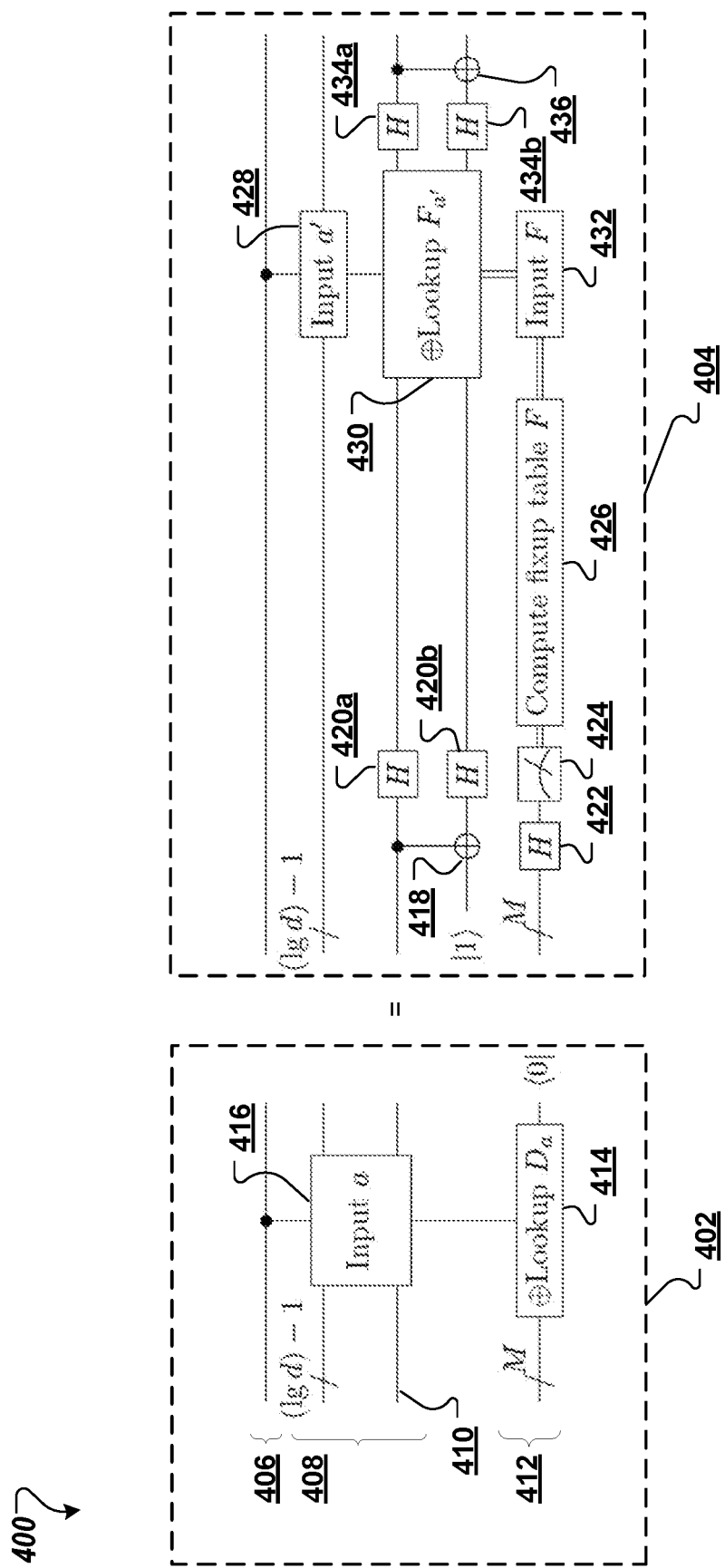
FIG. 4 is a circuit diagram of two example quantum circuits for un-computing a table lookup.

FIG. 4 is a circuit diagram 400 of two example quantum circuits for un-computing a table lookup. Quantum circuit 402 represents an uncomputation of a table lookup before the optimization process described in FIGS. 2 and 3 is applied. Quantum circuit 404 shows a specific sequence of operations for performing an uncomputation of a table lookup after the optimization process described in FIGS. 2 and 3 is applied. In other words, operations 418-436 can replace operations 414 and 416 as part of step 204 of FIG. 2.

The quantum circuit 402 operates on a control register 406, an address register 408, and a target register 412 of size M. In this example, the control register 406 includes one qubit. The address register 408 includes log d qubits, where d represents the total number of address register states. Qubit 410 represents the qubit in the address register that represents the least significant bit. The target register 412 includes M qubits.

Operation 414 represents a lookup operation $D_a$ that determines a set of address register states that need to have their amplitudes negated in order to uncompute the target register. Operation 416 represents a negation of the address register states that need to have their amplitudes negated in order to uncompute the target register, as determined by operation 414.

The quantum circuit 404 also operates on a control register 406, address register 408, and target register 412, as well as a clean ancilla qubit prepared in a 1 state. The quantum circuit 404 includes a CNOT gate 418 that targets the ancilla qubit prepared in the 1 state and uses the qubit 410 as a control. Application of the CNOT gate 418 corresponds to step 304 described above with reference to FIG. 3.

The quantum circuit 404 includes two Hadamard gates 420a, 420b that operate on qubit 410 and the clean ancilla qubit, respectively. Application of the Hadamard gates 420a, 420b corresponds to step 306 described above with reference to FIG. 3.

The quantum circuit 404 includes multiple Hadamard gates 422 that are applied to each qubit in the target register 412. The quantum circuit 404 further includes multiple measurement operations 424, e.g., X basis measurements, that are applied to each qubit in the target register 412 after application of the multiple Hadamard gates 422. Application of the Hadamard gates 422 and the measurement operations 424 corresponds to step 302 described above with reference to FIG. 3.

The quantum circuit 404 further includes an operation 426 representing the computation of the fixup table F described above with reference to FIG. 3. Operation 426 refers to the classical control system processing the measurement results in order to determine which address register values had their phase negated. The result of this process is a table F. This table is an input into the lookup that will be performed to fix the phase negations. Values of the computed fixup table F are provided as input 432 to the lookup operation 430 that is applied to qubit 410 and the clean ancilla qubit. The lookup operation 430 determines a necessary negation of amplitudes of the address register states (without the qubit representing the least significant bit). Operation 430 represents how the quantum address a' is being used to look up a value from the classically computed table F (subject to the control qubit seen in the same column being satisfied). This value is being xored into the indicated qubits. Operation 428 represents a negation of the address register states that need to have their amplitudes negated in order to uncompute the target register, as determined by operation 430. Application of operations 426-432 corresponds to step 308 described above with reference to FIG. 3.

The quantum circuit 404 includes two Hadamard gates 434a, 434b that operate on the qubit 410 and the clean ancilla qubit, respectively. The quantum circuit 404 further includes a CNOT operation 436 that targets the clean ancilla qubit and uses the qubit 410 as a control. Application of the Hadamard gates 434a, 434b and the CNOT gate 436 uncompute the qubit 410 and the clean ancilla qubit, corresponding to step 310 of FIG. 3.

In some implementations, if k additional clean ancilla qubits (qubits that are initialized to |0>) are available, the circuit optimization technique described above with reference to FIGS. 3 and 4 can be applied to achieve further reductions in the Toffoli cost of uncomputing a table lookup with address size d and output size M In particular, the Toffoli cost can be reduced to $\lceil d/k \rceil + k$.

In these implementations, to compute a table lookup a system allocates qubit registers $r_0, \ldots r_{k-1}$, where each qubit register $r_i$ includes M clean qubits initialized to a first state, e.g., a 0 state. This register will store the output of the computation of the table lookup. The system then computes the table lookup with address h targeting the registers $r_0, \ldots, r_{k-1}$, where h represents the superposed integer value of the top $\lceil \log(d/k) \rceil$ qubits of the address register. The data for register $r_l$ at address h is equal to the data from the original table at address h·k+l. In effect, this is reading many possible outputs at once. The application of this table lookup is referred to in this context as a T operation.

The system uses a series of Mk controlled swaps to permute the registers $r_0, \ldots, r_{k-1}$ such that register $r_l$ takes the place of register $r_0$ where l represents a superposed integer value of the bottom log k qubits in the address register. The other registers can be permuted in any order. This application of Mk controlled swaps is referred to in this context as an S operation.

The register $r_0$ then stores the output. Every computational basis value of the address register results in a specific computational basis value for registers $r_0, \ldots, r_{k-1}$ at this point. The equivalent of a table lookup targeting $r_0, \ldots, r_{k-1}$ has been computed.

The swapping subroutine S has a Toffoli count of M(k−1). The table lookup subroutine T has a Toffoli count of $\lceil d/k \rceil$. Both are performed once. Therefore, the total Toffoli count is $\lceil d/k \rceil + M(k-1)$. The space cost of the procedure is (k−1)M clean ancillae for workspace and $\lceil \log(d/k) \rceil$ clean ancillae in the implementation of T. The transformation also uses M qubits to store the output. The value of k that minimizes the Toffoli count is approximately $\sqrt{d/M}$. In practice the number of available clean qubits can bound k to be a much smaller value.

Figure 5:
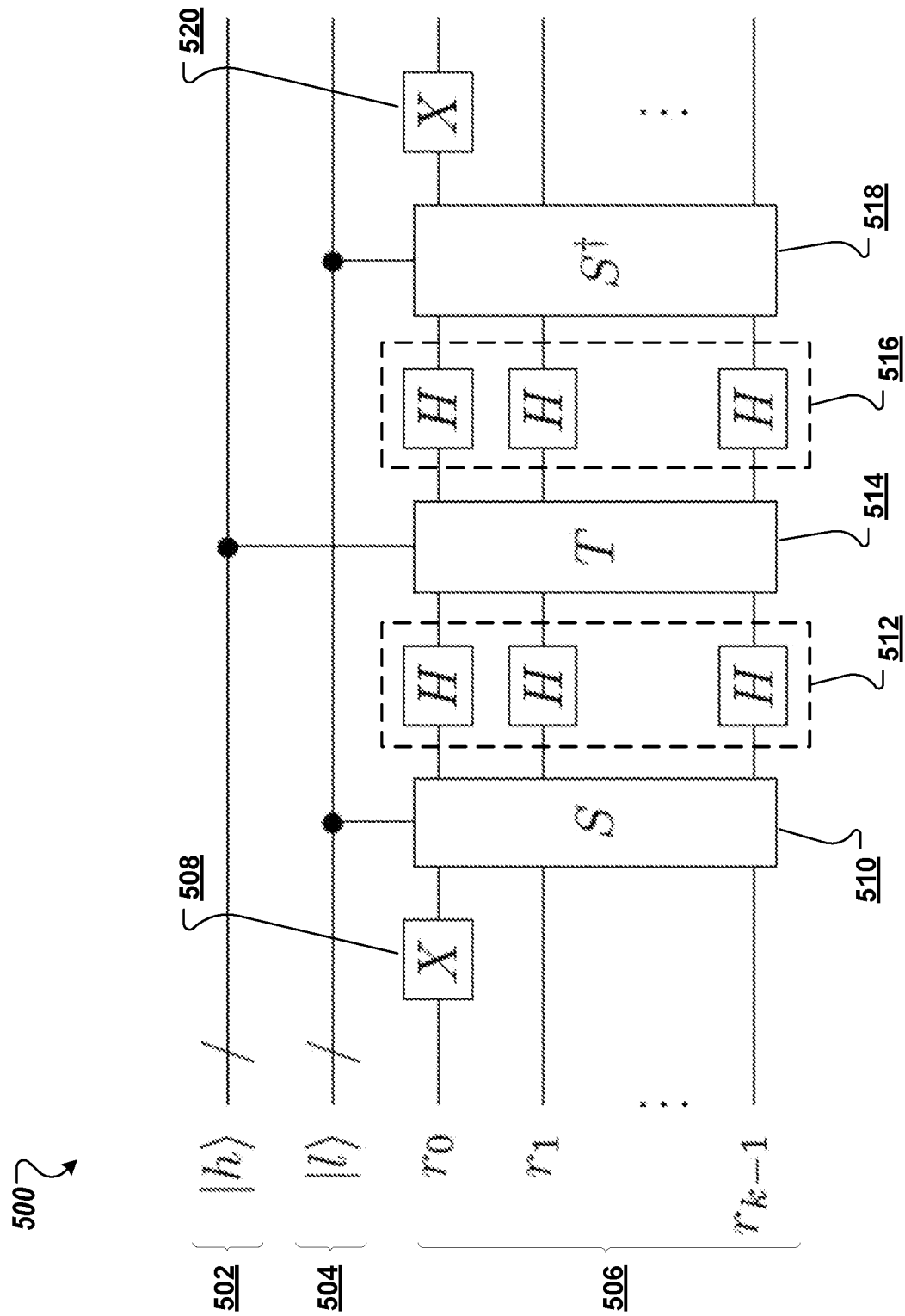
FIG. 5 is a circuit diagram of an example quantum circuit for applying a phase correction operation with clean ancilla qubits.

FIG. 5 is a circuit diagram of an example quantum circuit 500 for applying the phase correction operation 430 described above with reference to FIG. 4 with clean ancilla qubits. The example quantum circuit 500 includes a control register 502, address register 504, and ancilla registers $r_0, \ldots, r_{k-1}$ 506.

A first X gate 508 is applied to register $r_0$. The X gate 508 flips the state of the $r_0$ from |0> to |1>.

A controlled S operation (as defined above) 510 is applied to the ancilla register 506, where the address register acts as a control. The controlled S operation 510 shifts the |1> state of $r_0$ to position l, producing a one-hot unary encoding of the value in the bottom log k qubits in the address register 504.

Hadamard gates 512 are applied to each register $r_0, \ldots, r_{k-1}$. A controlled T gate (as defined above) 514 is applied to the ancilla register 506, where the address register acts as a control. Application of the Hadamard gates 512 and controlled T operation 514 yields the correct phase factor.

The operations 508, 510, and 512 combined perform a controlled swap operation. This operation is reversed to erase the unary encoding. That is, Hadamard gates 516 are applied to each qubit in the clean ancilla qubit register, a Hermitian conjugate of a controlled S operation 518 is applied to the ancilla register 506, where the address register acts as a control, and a second X gate 520 is applied to the register $r_0$.

The first controlled swap (operations 508, 510, and 512) has cost k−1, with the cost reduced as compared to the table lookup process/circuit described above with reference to FIGS. 3 and 4 because the outputs are single qubits instead of M-qubit registers. The T has cost $\lceil d/k \rceil$, and the final controlled swap (operations 516, 518 and 520) may be performed with Clifford gates because unary encodings can be erased using measurements and Clifford gates. There are k ancillae used for the unary encoding, and as before there are $\lceil \log(d/k) \rceil$ ancillae needed for the implementation of T.

In some implementations, if k additional dirty ancilla qubits (qubits that are not necessarily initialized to |0>) are available, the circuit optimization technique described above with reference to FIGS. 3 and 4 can be applied to achieve further reductions in the Toffoli cost of uncomputing a table lookup with address size d and output size M In particular, the Toffoli cost can be reduced to $2\lceil d/k \rceil + 4k$.

In these implementations, to compute a table lookup a system allocates a register $r_0$ with M clean qubits in a plus state. This register will store the output. The system obtains registers $r_1, \ldots, r_{k-1}$ each of size M containing dirty ancilla qubits. The system then uses a series of $M(k-1)$ controlled swaps to permite the registers $r_0, \ldots, r_{k-1}$ such that register $r_0$ takes the place of register $r_l$ where l represents a superposed integer value of the bottom log k qubits in the address register. The other registers can be permuted in any order. This application of $M(k-1)$ controlled swaps is referred to in this context as an S operation.

The system performs a table lookup with address h targeting the registers $r_0, \ldots, r_{k-1}$, where h represents the superposed integer value of the top $\lceil \log(d/k) \rceil$ qubits of the address register. The data for register $r_l$ at address h is equal to the data from the original table at address h·k+l. In effect, this is reading many possible outputs at once. The application of this table lookup is referred to in this context as a T operation.

The system performs the inverse of the S operation. The system applies Hadamard gates to $r_0$. Because the qubits in $r_0$ were in the plus state, they are not affected by the T operation (which only targeted them with controlled bit flips). Therefore, the system applies Hadamard gates to $r_0$ so that $r_0$ will be affected by the next T operation, which will uncompute the dirt XOR-ed into the other registers $r_1, \ldots, r_{k-1}$.

The system performs S, T, then the inverse of S. The register $r_0$ then stores the output, and the other registers $r_1$, $r_{k-1}$ are restored. These restored registers can be "returned," that is used for another purpose.

The swapping subroutine S has a Toffoli count of $M(k-1)$. The table lookup subroutine T has a Toffoli count of $\lceil d/k \rceil$. The S operation is computed/un-computed four times and T is performed twice. Therefore, the total Toffoli count is $2\lceil d/k \rceil + 4M(k-1)$. The space cost of the procedure is $(k-1)M$ dirty ancillae for workspace and $\lceil \log(d/k) \rceil$ clean ancillae in the implementation of T.

The transformation also uses M qubits to store the output. The value of k that minimizes the Toffoli count is approximately $\sqrt{2d/M}$. In practice the number of available dirty qubits can bound k to be a much smaller value. The value of k must be greater than 2 in order to have a Toffoli count lower than a standard lookup.

Figure 6:
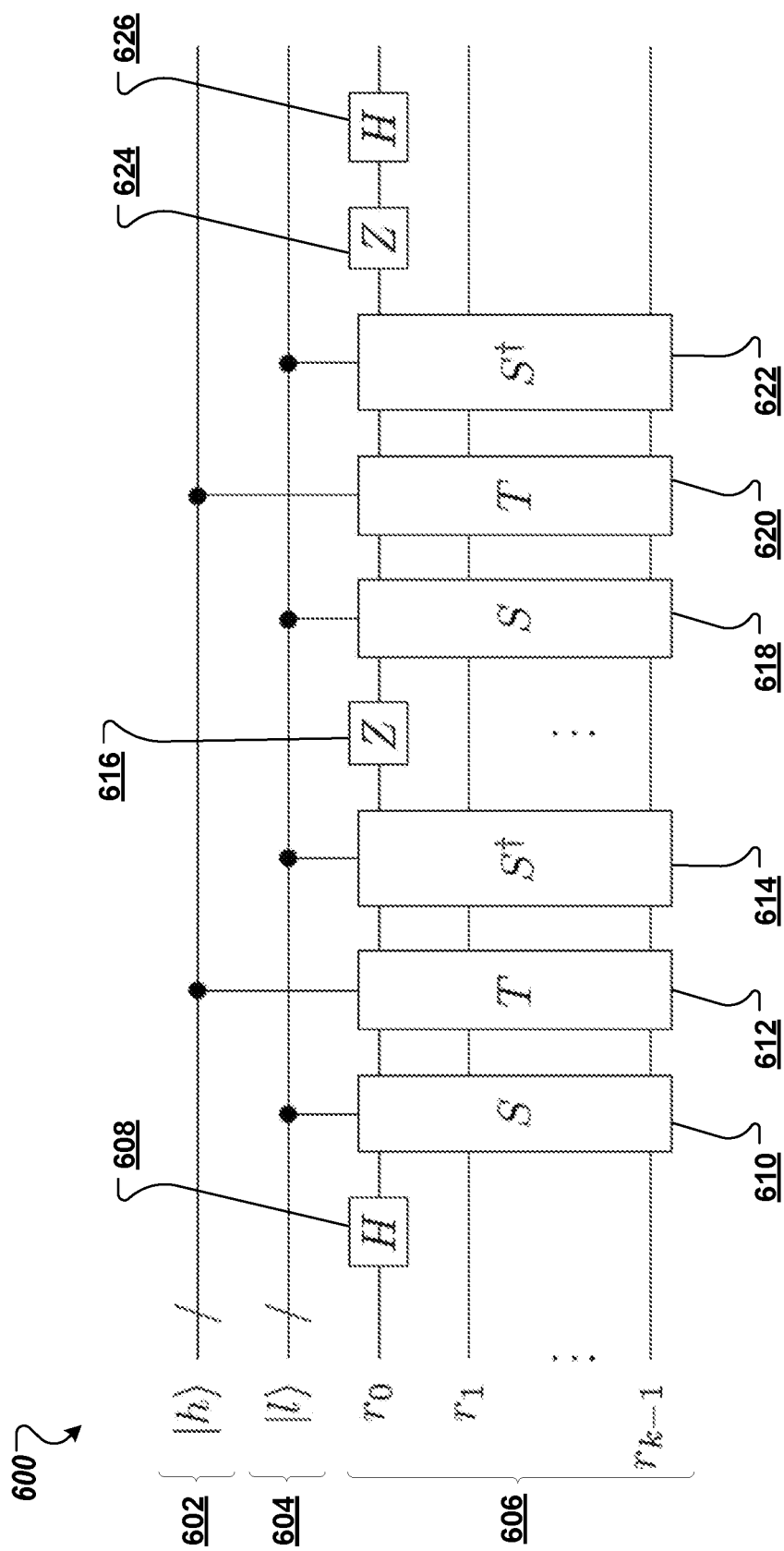
FIG. 6 is a circuit diagram of an example quantum circuit for applying a phase correction operation with dirty ancilla qubits.

FIG. 6 is a circuit diagram of an example quantum circuit 600 for applying the phase correction operation 430 described above with reference to FIG. 4 with dirty ancilla qubits. The example quantum circuit 600 includes a control register 602, address register 604, and ancilla register 606. The first qubit $r_0$ in the ancilla register 606 is a clean qubit and is initially set to $|0\rangle$. The qubits $r_1, \ldots, r_{k-1}$ in the ancilla register 606 are dirty qubits and not necessarily initially set to $|0\rangle$.

A first Hadamard gate 608 is applied to the first qubit $r_0$ in the ancilla register 606. The Hadamard gate 608 creates a superposition state.

A controlled S operation 610 is applied to the ancilla register 606, where the address register acts as a control. A controlled T operation 612 is applied to the ancilla register 606, where the control register acts as a control. A Hermitian conjugate of a controlled S operation 614 is applied to the ancilla register 606, where the address register acts as a control. The gates 610, 612 and 614 have no effect on the first qubit $r_0$.

A Z gate 616 is applied to the qubit $r_0$. Application of the Z gate 616 changes the state of the qubit to $(|0\rangle - |1\rangle)/\sqrt{2}$.

The operations 610, 612 and 614 are reversed through implementations of controlled S operation 618, controlled T operation 620 and Hermitian conjugate of a controlled S operation 622. The controlled T gate 620 yields the correct phase factor. A Z gate 624 and a Hadamard gate 626 are applied to the first qubit $r_0$ to return the state of $r_0$ to $|0\rangle$.

There are k−1 dirty ancilla qubits used, one clean ancilla, and $\lceil \log(d/k) \rceil$ clean ancilla qubits needed for the implementation of T. In the case of clean ancilla qubits, the Toffoli cost is minimized for $k \approx \sqrt{d}$, where the Toffoli count is $2\sqrt{d}$. For dirty ancillae, the cost is minimized at $k \approx \sqrt{d/2}$, where the Toffoli count is $\sqrt{32d}$.

Implementations of the digital and/or quantum subject matter and the digital functional operations and quantum operations described in this specification and appendix can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators. Quantum computation systems in general and quantum computers specifically may be realized or based on different quantum computational models and architectures. For example, the quantum computation system may be based on or described by models such as the quantum circuit model, one-way quantum computation, adiabatic quantum computation, holonomic quantum computation, analog quantum computation, digital quantum computation, or topological quantum computation.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

Elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for uncomputing one or more qubits, the method comprising:
   identifying one or more sequences of operations for performing an un-compute operation on the one or more qubits, respectively;
   for each identified sequence of operations:
      replacing the sequence of operations with an X basis measurement and a classically-controlled phase correction operation to provide an adjusted sequence of operations for performing the un-compute operation, wherein a result of the X basis measurement acts as a control for the classically-controlled correction phase operation; and
   executing the adjusted one or more sequences of operations on the one or more qubits, respectively.

2. The method of claim 1, wherein a first sequence of operations for un-computing a respective qubit comprises a first subset of operations that put the qubit in a known state, for example a zero state.

3. The method of claim 1, wherein the identified one or more sequences of operations comprise X-axis interactions.

4. The method of claim 1, wherein the identified one or more sequences of operations comprise at least one CNOT operation that targets a first qubit and uses a second qubit as a control.

5. The method of claim 4, wherein replacing the sequence of operations comprises replacing the CNOT operation with:
   a measurement of the first qubit in the X basis, and
   application of a Z gate on the first qubit, wherein application of the Z gate is conditioned on a result of the measurement of the first qubit in the X basis.

6. The method of claim 1, wherein executing the adjusted one or more sequences of operations on the one or more qubits comprises executing the adjusted one or more sequences of operations on the one or more qubits in a surface-code architecture.

7. The method of claim 1, wherein the one or more sequences of operations for performing an un-compute operation on the one or more qubits are part of a quantum circuit, the quantum circuit comprising multiple operations for uncomputing a table lookup operation, wherein the multiple operations operates on i) a control register comprising one or more qubits, ii) an address register comprising one or more qubits, and iii) a target register comprising one or more qubits.

8. The method of claim 7, wherein replacing the sequence of operations with an X basis measurement and a classically-controlled phase correction operation to provide an adjusted one or more sequence of operations for performing the un-compute operation comprises generating an adjusted quantum circuit.

9. The method of claim 8, wherein executing the adjusted one or more sequences of operations on the one or more qubits, respectively, comprises executing the adjusted quantum circuit, comprising:
   applying a CNOT operation to a first qubit in the address register and a second qubit, wherein: the first qubit represents a least significant bit, the second qubit comprises an ancilla qubit prepared in a 1 state, and the first qubit acts as a control for the CNOT operation;
   applying a first Hadamard gate to the first qubit and a second Hadamard gate to the second qubit;
   applying multiple X basis measurements on qubits in the target register to determine a set of address register states that require an amplitude negation to uncompute the table lookup operation;
   applying a classically controlled phase correction operation based on the determined set of address register states, comprising applying an additional table lookup computation from a fixup table onto the first qubit and second qubit to negate amplitudes of the states in the determined set of address register states; and
   uncomputing the first qubit and second qubit.

10. The method of claim 9, wherein entries of the fixup table specify respective two output bits defined by the determined set of states.

11. The method of claim 10, wherein uncomputing the first qubit and the second qubit comprises:
    applying a third Hadamard gate to the first qubit and a fourth Hadamard gate to the second qubit, and
    applying a CNOT operation to the first qubit and second qubit, where the first qubit acts as a control for the CNOT operation.

12. The method of claim 9, wherein the adjusted quantum circuit is configured to operate on multiple dirty ancilla qubits.

13. An apparatus comprising:
    one or more classical processors; and
    quantum computing hardware in data communication with the one or more classical processors,
    wherein the one or more classical processors comprise one or more storage devices storing instructions that are operable, when executed by the one or more classical processors, to cause the one or more classical processors to perform operations comprising:
       identifying one or more sequences of operations for performing an un-compute operation on one or more qubits, respectively;

for each identified sequence of operations, replacing the sequence of operations with an X basis measurement and a classically-controlled phase correction operation to provide an adjusted sequence of operations for performing the un-compute operation, wherein a result of the X basis measurement acts as a control for the classically-controlled correction phase operation; and executing the adjusted one or more sequences of operations on the one or more qubits, respectively.

14. The apparatus of claim 13, wherein the quantum computing hardware comprises:

one or more registers of qubits;

a plurality of control lines coupled to the one or more registers of qubits;

a plurality of control circuits coupled to the plurality of control lines.

15. The apparatus of claim 14, wherein the one or more sequences of operations for performing an un-compute operation on the one or more qubits are part of a quantum circuit, the quantum circuit comprising multiple operations for uncomputing a table lookup operation, wherein the multiple operations operates on i) a control register comprising one or more qubits, ii) an address register comprising one or more qubits, and iii) a target register comprising one or more qubits.

16. The apparatus of claim 15, wherein replacing the sequence of operations with an X basis measurement and a classically-controlled phase correction operation to provide an adjusted one or more sequence of operations for performing the un-compute operation comprises generating an adjusted quantum circuit.

17. The apparatus of claim 16, wherein executing the adjusted one or more sequences of operations on the one or more qubits, respectively, comprises executing the adjusted quantum circuit using the plurality of control circuits, the executing comprising:

applying a CNOT operation to a first qubit in the address register and a second qubit, wherein: the first qubit represents a least significant bit, the second qubit comprises an ancilla qubit prepared in a 1 state, and the first qubit acts as a control for the CNOT operation;

applying a first Hadamard gate to the first qubit and a second Hadamard gate to the second qubit;

applying multiple X basis measurements on qubits in the target register to determine a set of address register states that require an amplitude negation to uncompute the table lookup operation;

applying a classically controlled phase correction operation based on the determined set of address register states, comprising applying an additional table lookup computation from a fixup table onto the first qubit and second qubit to negate amplitudes of the states in the determined set of address register states; and uncomputing the first qubit and second qubit.

18. The apparatus of claim 17, wherein entries of the fixup table specify respective two output bits defined by the determined set of states.

* * * * *